United States Patent [19]

Lee

[11] Patent Number: 5,179,428
[45] Date of Patent: Jan. 12, 1993

[54] THREE DIMENSIONAL CCD IMAGE SENSOR

[75] Inventor: Sung M. Lee, Seoul, Rep. of Korea

[73] Assignee: Gold Star Electron Co., Ltd., Rep. of Korea

[21] Appl. No.: 727,276

[22] Filed: Jul. 11, 1991

[30] Foreign Application Priority Data

Jul. 12, 1990 [KR] Rep. of Korea .......................... 10601

[51] Int. Cl.$^5$ ..................... H01L 29/78; H01L 27/14; H01L 31/00
[52] U.S. Cl. .............................. 257/233; 358/213.23; 257/292
[58] Field of Search .................. 357/24 LR, 30 H, 31, 357/32, 30 G, 30 P; 358/213.23, 213.26

[56] References Cited
U.S. PATENT DOCUMENTS 4,450,464  5/1984  Yamada .......................... 357/24 LR Primary Examiner—Rolf Hille
Assistant Examiner—Robert Limanek

[57] ABSTRACT

A three-dimensional CCD image sensor comprising a plurality of N type light receiving regions being formed on a two-dimensional plane; a plurality of N type VCCD regions being formed under said plurality of N type light receiving regions; a series of arrangement that said plurality of N type light receiving regions and said plurality of N type VCCD regions are formed opposite to each other being configured in sequence at a desired interval; a desired area of a charge transfer path being formed between each of said plurality of N type light receiving regions and each of said plurality of N type VCCD regions; and a P$^+$ type charge transfer barrier being formed to a predetermined thickness at the remaining portion except where said charge transfer path is to be formed, between each of said plurality of N type light receiving regions and each of said plurality of N type VCCD regions. In accordance with the present invention, only a plurality of N type light receiving regions for receiving light are arranged at a desired interval on the two-dimensional plane. Also, a plurality of N type VCCD regions as light transmitting regions are formed three-dimensionally under the N type light receiving regions. Therefore, the fill factor of the light receiving region can be enhanced significantly.

11 Claims, 13 Drawing Sheets

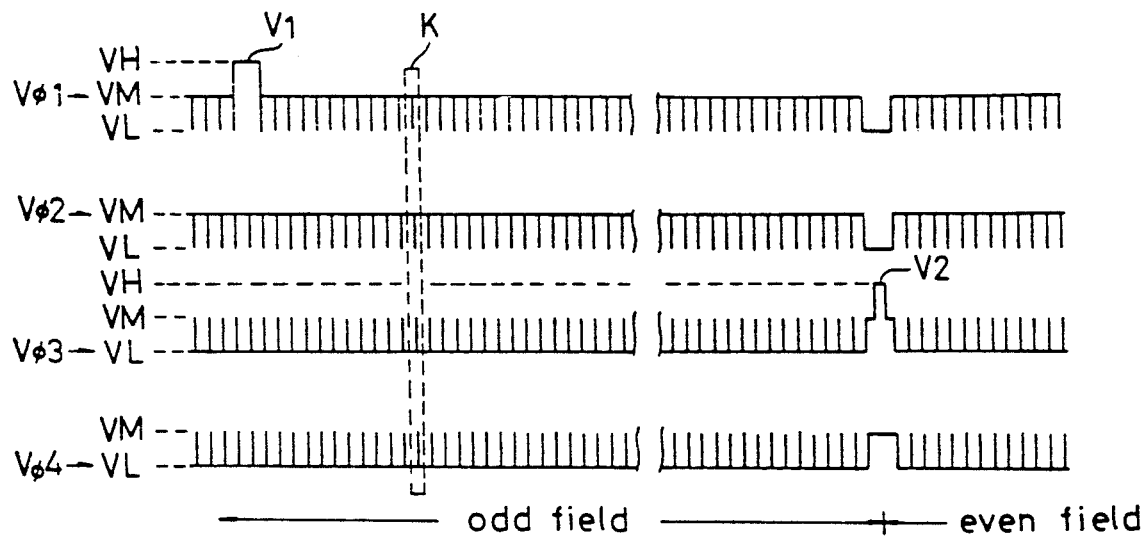
FIG. 3a
PRIOR ART
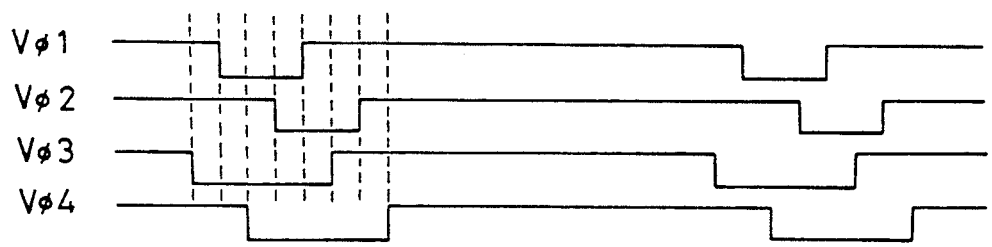
FIG. 3b
PRIOR ART
FIG. 3c
PRIOR ART

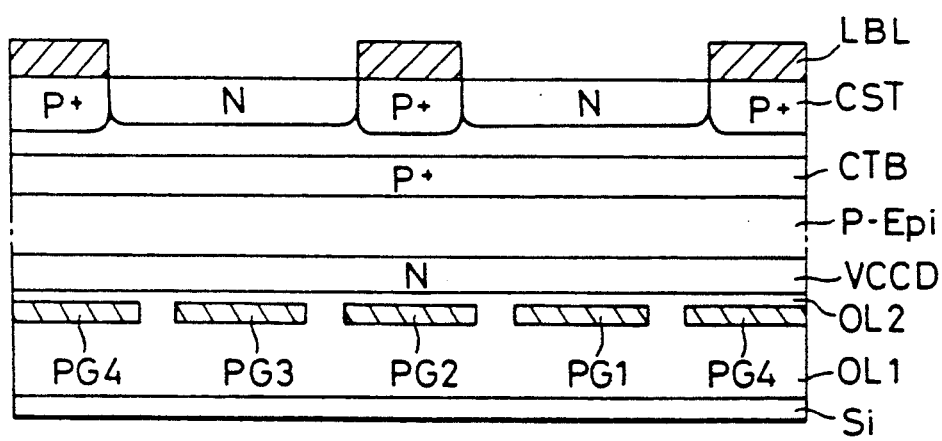
F I G. 4e

F I G. 6b
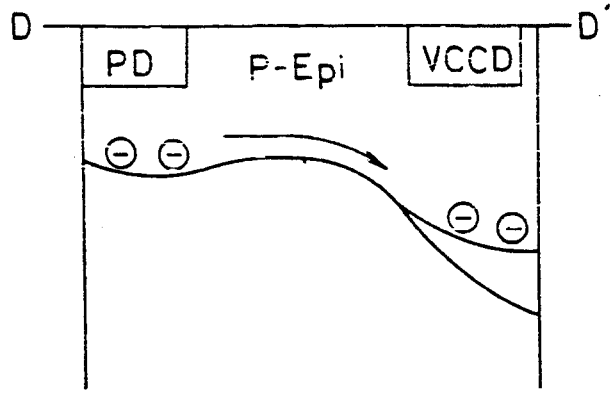
F I G. 7a
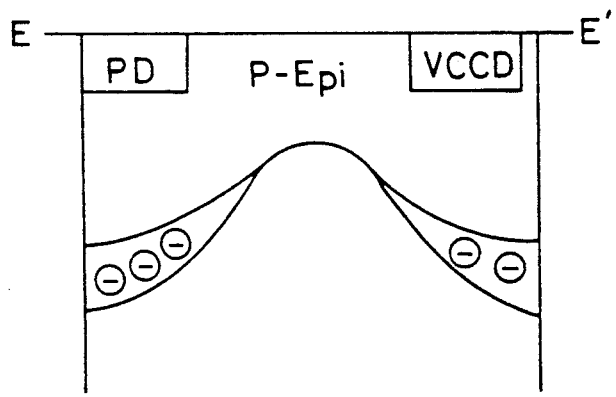
F I G. 7b
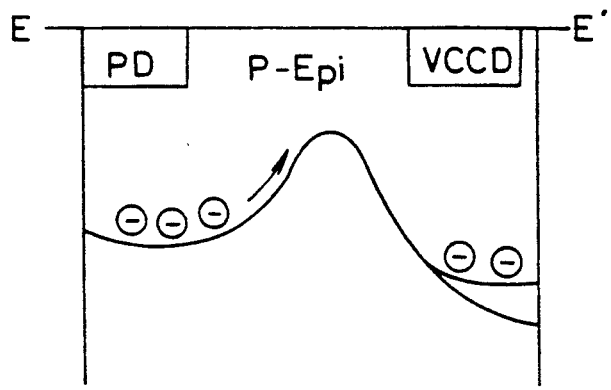

THREE DIMENSIONAL CCD IMAGE SENSOR

BACKGROUND OF THE INVENTION

1. Field of the Invention

The present invention relates in general to a three-dimensional charge coupled device (CCD) image sensor, and more particularly to a three-dimensional CCD image sensor having a silicon on insulator (SOI) structure for enhancing a resolution of the screen.

2. Description of the Prior Art

Generally, a CCD is an active device for transferring, under the control of a clock pulse, a signal charge corresponding to incident light incoming along a predetermined path and has typically been used in image processing devices, such as, for example, storage devices, logic elements, CCD image sensors and similar devices.

A CCD image sensor is generally formed by disposing a plurality of photodetectors and a plurality of CCDs as a photoscanner on a substrate of a semi-conductor material, such as silicon oxide. For the purpose of increasing the resolution of the CCD image sensor, it is preferable to design the area of the CCD, and particularly, a vertical charge coupled device (VCCD) to be as small as possible such that the effective area of the photodetector is relatively larger. It is particularly preferable in the CCD image sensor of an interline transfer type in which VCCDs are disposed between columns of the photodetector.

For instance, the photodetector may be a PN junction device, a metal insulator semi-conductor (MIS) device, a Schottky junction device and etc.

The scanning of the CCD image sensor employing the CCD as a photoscanner may be of an interlaced scanning type or a non-interlaced scanning type.

In the non-interlaced scanning, there is provided one picture, i.e., one frame containing a plurality of fields, with the scanning on the screen beginning with data in the first input field, as shown in FIG. 1a.

In FIG. 1a, the displays of each of fields on the screen in its input order are designated with the numerals 1, 2, 3, . . . .

On the other hand, in interlaced scanning, there is provided one frame containing a plurality of even fields and a plurality of odd fields, with the scanning on the screen beginning with data in the odd field, as shown in FIG. 1b.

In FIG. 1b, the numeral 1 designates each of the odd fields and the numeral 2 designates each of the even fields.

Therefore, in the non-interlaced scanning, the scanning rate is fast such that the actual image of a fast moving object can be picked up accurately. For this reason, the non-interlaced scanning may be applied to a military equipment, such as a missile.

However, a problem with this non-interlaced scanning is that the image shakes on the screen.

For interlaced scanning, there is provided a sense of stability of the image in that the scanning rate is slower than that in the non-interlaced scanning, but a fast moving object appears as two images. For this reason, interlaced scanning is inappropriate to a military purpose and typically applied to a TV broadcasting system, such as a NTSC system or a PAL system, for the scanning of image on the screen.

Now, a construction of a conventional CCD image sensor of the interlaced scanning type will be described with reference to FIGS. 2a through 2d.

Referring to FIG. 2a, there is shown a schematic diagram of a construction of the conventional CCD image sensor of the interlaced scanning type. The conventional CCD image sensor comprises a N type VCCD and a plurality of N type VCCDs, to each of which a series of N type photodiodes PDs are connected. The output of each of the N type photodiodes PDs is connected to the N type VCCD such that an image signal charge outputted therefrom is transferred to the N type VCCD in a single direction. Also, the N type VCCDs are connected to the N type HCCD such that the signal charges transferred from the photodiodes PDs are transferred to the N type HCCD simultaneously in response to first to fourth VCCD clock signals V$\phi$1-V$\phi$4, one clock signal corresponding to one phase.

Referring to FIG. 2b, there is shown a layout diagram of the construction of the conventional CCD image sensor in FIG. 2a. The CCD image sensor comprises a channel stop region CST formed between each of the N type VCCDs and each of the N type photodiodes PD. An odd gate electrode PG1 is formed over each of the N type VCCDs and each of the channel stop regions CSTs such that it is connected to each of transfer gates TG1s of the N type photodiodes PD arranged in an odd horizontal line, the odd gate electrode PG1 being applied with the first and the second clock signals V$\phi$1-V$\phi$2. On the other hand, an even gate electrode PG2 is formed over each of the channel stop regions CSTs, each of the N type VCCDs and each of the N type photodiodes PD such that it is connected to each of transfer gates TG2s of the N type photodiodes PD arranged in an even horizontal line, the even gate electrode PG2 being applied with the third and the fourth clock signals V$\phi$3-V$\phi$4.

The forming of the odd gate electrodes PG1 and the even gate electrodes PG2 may be repeated successively, as they are required, in the same form. Also, these electrodes PG1 and PG2 are generally electrically isolated from each other by a region (not shown) of an insulating material, such as silicon oxide.

On the other hand, a material of the transfer gates TG1 and TG2 and the odd and even gate electrodes PG1 and PG2 may be polysilicon.

The odd gate electrode PG1 includes a first odd gate electrode PG1a formed under each of the N type photodiodes PD in the odd horizontal line and a second odd gate electrode PG1b formed over each of the N type photodiodes PD in the odd horizontal line and connected to each of the transfer gates TG1s of the photodiodes PD in the odd horizontal line, the first odd gate electrode PG1a being supplied with the second VCCD clock signal V$\phi$2 and the second odd gate electrode PG1b being supplied with the first VCCD clock signal V$\phi$1.

The even gate electrode PG2 includes a first even gate electrode PG2a formed under each of the N type photodiodes PD in the even horizontal line and a second even gate electrode PG2b formed over each of the N type photodiodes PD in the even horizontal line and connected to each of the transfer gates TG2s of the photodiodes PD in the even horizontal line, the first even gate electrode PG2a being applied with the fourth VCCD the second V$\phi$4 and the second even gate electrode PG2b being applied with the third VCCD clock signal Vφ3.

Also, the first through the fourth VCCD clock signals Vφ1-Vφ4 of four phases correspond to one of two fields, i.e. an even field or an odd field. The clocking operation of the N type VCCD will be described hereinafter in more detail.

Referring to FIG. 2c, there is shown a sectional view, taken on the line A—A' of FIG. 2b. The conventional CCD image sensor comprises a N type substrate 100 and a P type well 200, formed on the N type substrate 100. Also on the N type substrate 100 are configured a series of arrangements of the N type photodiodes PD and the N type VCCDs in even horizontal lines which are connected to each other at desired intervals via the channel stop region CST. Each of the transfer gates TG2 is formed over and between each of the N type photodiodes PD and its associated N type VCCDs to connect them with each other. Also over the surface of each of the N type VCCDs is formed the second even gate electrode PG2b of the even gate electrode PG2 which is supplied with the third VCCD clock signal Vφ3, to be connected to each of the transfer gates TG2 of the N type photodiodes PD arranged in the even horizontal line.

Herein, the P type well 200 is comprised of two types, a shallow P type well 200a and a deep P type well 200b, for the control of over flow drain (OFD) voltage.

On the surface of each of the N type photodiodes PD is generally formed a P+ type thin layer 300 for the applying of an initial bias. In FIG. 2c, the lower side of the channel stop region CST designated as the character P+ indicates a channel stop ion.

Referring to FIG. 2d, there is shown a sectional view, taken on the line B—B' of FIG. 2b. The P type well 200 is formed on the N type substrate 100, identically to FIG. 2c. Also on the N type substrate 100 are configured several arrangements of N type photodiodes PD and the N type VCCDs in an even horizontal line which are connected to each other at desired intervals via the channel stop region CST. Also over the surface of each of the N type VCCDs is formed the first even gate electrode PG2a of the even gate electrode PG2 which is driven by the fourth VCCD clock signal Vφ4. Similarly, on the surface of each of the N type photodiodes PD is generally formed the P+ type thin layer 300 for the applying an initial bias. In FIG. 2d, the lower side of the channel stop region CST, designated by the character P+ indicates a channel stop ion. Herein, the P type well 200 is comprised of the shallow P type well 200a and the deep P type well 200b, for the control of over flow drain (OFD) voltage.

Hence, the transfer gate TG1 of each of the N type photodiodes PD arranged in the odd horizontal line is driven only by the first VCCD clock signal Vφ1 which is applied to the second odd gate electrode PG1b of odd gate electrode PG1, and the transfer gate TG2 of each of the N type photodiodes PD arranged in even horizontal line is driven only by the third VCCD clock signal Vφ3 which is applied to the second even gate electrode PG2b of the even gate electrode PG2.

The second VCCD clock signal Vφ2 being applied to the first odd gate electrode PG1a of the odd gate electrode PG1 and the fourth VCCD clock signal Vφ4 being applied to the first even gate electrode PG2a of the even gate electrode PG2 serve merely to transfer image signal charges traveling from the N type photodiodes PD arranged in the odd and even horizontal lines toward the horizontal charge coupled device (HCCD).

The operation of the conventional CCD image sensor of the above-mentioned construction will now be described with reference to FIGS. 3a through 3c.

Referring to FIG. 3a, there is shown a timing diagram of the first through fourth VCCD clock signals Vφ1-Vφ4 of four phases, each including two fields, an even field and an odd field.

In this drawing, in the odd field of the first VCCD clock signal Vφ1 being applied to the second odd gate electrode PG1b of the odd gate electrode PG1 is contained a high drive voltage signal V1 to the transfer gate. Also in the even field of the third VCCD clock signal Vφ3 being applied to the second even gate electrode PG2b of the odd gate electrode PG2 is contained a high drive voltage signal V2 to the transfer gate.

First, if the first through fourth VCCD clock signals Vφ1-Vφ4 in the odd field are applied simultaneously, the transfer gates TG1s of the N type photodiodes PD arranged in each of the odd horizontal lines are turned on simultaneously by the transfer gate drive voltage signal V1 contained in the first VCCD clock signal Vφ1.

For this reason, the image signal charges produced from the N type photodiodes PD are transferred to the N type VCCDs and then toward the N type HCCD by the VCCD clocking operation.

Referring to FIG. 3b, there is shown a pulse waveform diagram of the first through fourth clock signals Vφ1-Vφ4 at the unit interval K of FIG. 3a. The image signal charges produced from the N type photodiodes PD are transferred vertically toward the N type HCCD by a series of clocking operations as shown in FIG. 3b.

At this time, the second VCCD clock signal Vφ2 being applied through the first odd gate electrode PG1a of the odd gate electrode PG1 formed in the lower side of the odd horizontal line serves merely to transfer the image signal charges transferred from the N type photodiodes PD arranged in the even horizontal line by the first VCCD clock signal Vφ1 to the N type HCCD, together with the first VCCD clock signal Vφ1.

Thereafter, if the first through fourth VCCD clock signals Vφ1-Vφ4 in the even field in FIG. 3a are applied simultaneously, the transfer gates TG2 of the N type photodiodes PD arranged in each of the even horizontal lines are turned on simultaneously by the transfer gate drive voltage signals V2 contained in the third VCCD clock signal Vφ3.

For this reason, the image signal charges produced from the N type photodiodes PD in the even horizontal line are transferred to the N type VCCDs and then toward the N type HCCD by the VCCD clocking operation as shown in FIG. 3a, in the same manner as those of the odd field.

At this time, the fourth VCCD clock signal Vφ4 being applied through the first even gate electrode PG2a of the even gate electrode PG2 formed in the lower side of the even horizontal line serves merely to transfer the image signal charges transferred from the N type photodiodes PD arranged in the even horizontal line by the third VCCD clock signal Vφ3 to the N type HCCD, together with the third VCCD clock signal Vφ3.

As stated, the use of the VCCD clock signals of four phases has the effect of transferring the image signal charge in amount more than that of the VCCD clock signals of two phases.

As a result, as mentioned above, by utilizing VCCD clocking signals of four phases, i.e. the first through fourth VCCD clock signals V$\phi$1-V$\phi$4 as shown in FIG. 3a, the image signal charges from the N type photodiodes PD arranged in the odd horizontal line are first in sequence scanned on the screen through the N type VCCDs and then through the N type HCCD and then the image signal charges from the N type photodiodes PD arranged in the even horizontal line are in sequence scanned on the screen through the N type VCCDs and then through the N type HCCD.

As previously stated, the scanning of the CCD image sensor as mentioned above is usually referred to as an interlaced scanning type.

Referring to FIG. 3c, there is shown a pixel format of one picture, or one frame, the picture being comprised of pixels, each being displayed as the numerals 1 and 2, each designating the image signal charges from the N type photodiodes PD arranged in the odd and even horizontal lines as shown in FIG. 2a, respectively.

However, the conventional CCD image sensor of the above-mentioned interlaced scanning type has been used broadly in a TV broadcasting system, such as a NTSC system or a PAL system, but has a disadvantage, in that the VCCD area, which is irrelevant to the reception of the image signal, is given much more weight in the total chip area of the CCD image sensor since a VCCD is located at every column of the photodetector. In other words, because the photodetector, the VCCD and the HCCD are all on a two-dimensional plane, the fill factor, i.e., the area possessed by the photodetector portion is reduced relatively. Therefore, in conventional CCD image sensors, there is a limit to an increase in the resolution of the screen.

SUMMARY OF THE INVENTION

Therefore, it is an object of the present invention to provide a three-dimensional CCD image sensor having a plurality of N type light receiving regions formed on a surface thereof, a plurality of N type VCCDs and a N type HCCD as light transmitting regions, each being formed three-dimensionally under the N type light receiving regions, for maximizing the fill factor of the N type light receiving region, using a SOI structure.

In accordance with the present invention, the object can be accomplished by providing a three dimensional CCD image sensor, comprising a silicon substrate; an oxide layer being formed to a desired thickness on said silicon substrate; a plurality of gate electrodes being formed of polysilicon layers separated from each other by a desired separation interval on said oxide layer, said gate electrodes constructed and arranged for receiving clock signals; a thin gate oxide layer being formed on the whole surface of said oxide layer including said plurality of gate electrodes; an N+ type ion layer being formed on the surface of gate oxide layer using a low energy; a P type epitaxial layer being formed to a predetermined thickness on said gate oxide layer and N+ type ion layers; a plurality of N type light receiving regions being formed on the upper surface of said P type epitaxial layer, for receiving light; a plurality of N type VCCD regions being formed on the lower surface of said P type epitaxial layer by diffusing the N+ regions, for inputting signal charges of light being produced from said plurality of N type light receiving regions; wherein the layers are arranged such that said plurality of N type light receiving regions and said plurality of N type VCCD regions are formed opposite to each other and spaced in sequence at a desired spacing interval on said upper and lower surfaces of said P type epitaxial layer; and a desired area of a charge transfer path being formed between each of said plurality of N type light receiving regions and each of said plurality of N type VCCD regions, said signal charges of light being passed through said charge transfer path; a P+ type charge transfer barrier being formed to a predetermined thickness at the remaining portion, between each of said plurality of N type light receiving regions and each of said plurality of N type VCCD regions except where said charge transfer path is to be formed; whereby said signal charges stored in the lower side of each said Plurality of N type light receiving regions (10) are transferred to the corresponding N type VCCD regions (7) by clock signals applied to said gate electrodes.

BRIEF DESCRIPTION OF THE DRAWINGS

The above and other objects, features and advantages of the present invention will be more clearly understood from the following detailed description taken in conjunction with the accompanying drawings, in which:

FIG. 2b is a layout diagram of the construction of the conventional CCD image sensor in FIG. 2a;

FIG. 3a is a timing diagram of VCCD clock signals in the conventional CCD image sensor of the interlaced scanning type;

FIG. 3b is a pulse waveform diagram of the VCCD clock signals at the unit interval K of FIG. 3a;

FIG. 3c is a pixel format of one picture, or one frame in the conventional CCD image sensor of the interlaced scanning type;

FIG. 4b is a layout diagram of a portion of P in FIG. 4a;

FIG. 4e is a sectional view, taken on the line C—C' of FIG. 4b;

FIGS. 6a and 6b are views illustrating potential profiles, taken on the line D—D' of FIG. 4c; and FIGS. 7a and 7b are views illustrating potential profiles, taken on the line E—E' of FIG. 4c.

DETAILED DESCRIPTION OF THE INVENTION

First, an embodiment of a three-dimensional CCD image sensor of the present invention will be described with reference to FIGS. 4a through 4f.

Figure 1A:
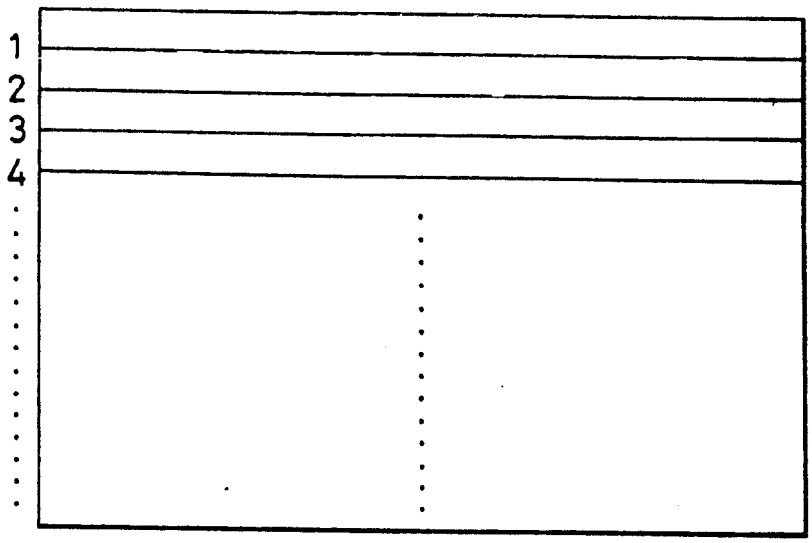
FIG. 1a is a view illustrating a non-interlaced scanning of a CCD image sensor.
Figure 1B:
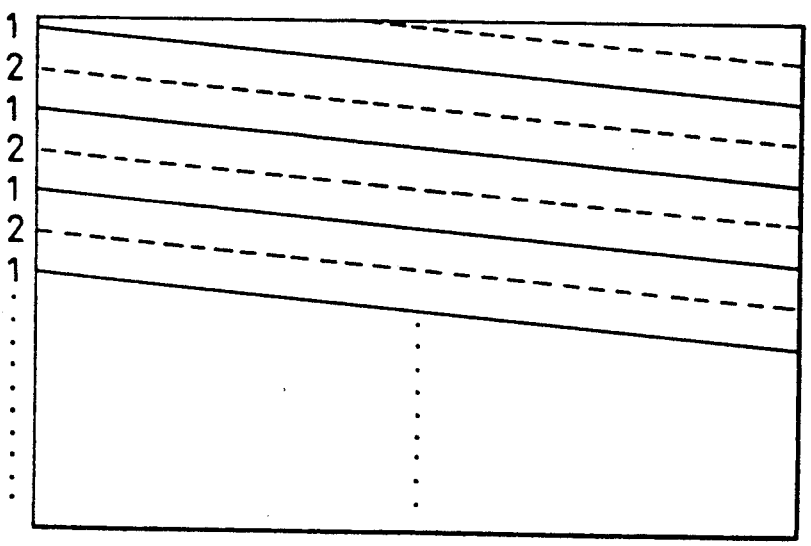
FIG. 1b is a view illustrating an interlaced scanning of the CCD image sensor.
Figure 2A:
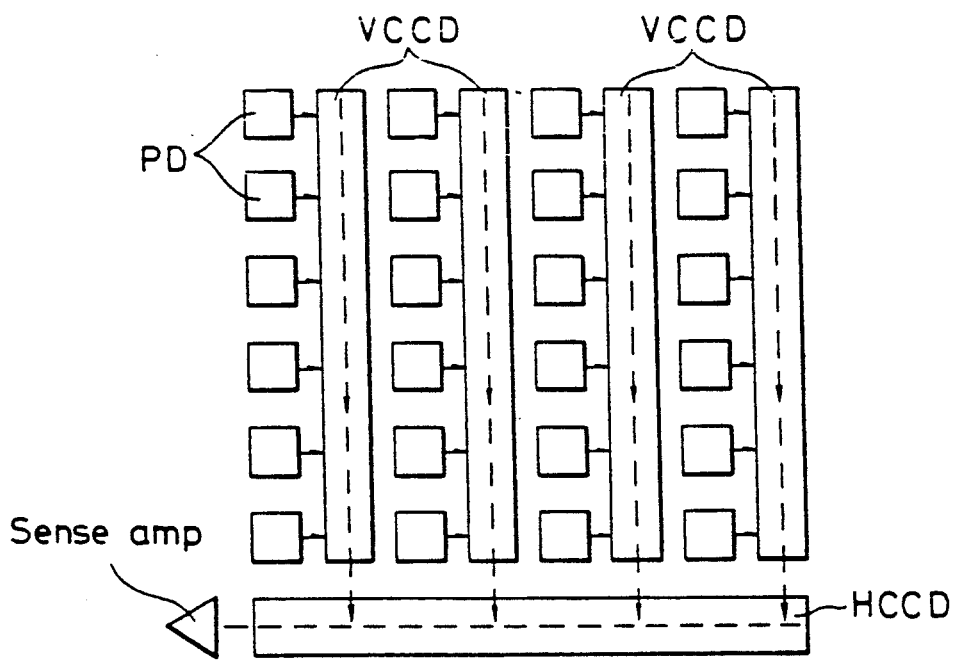
FIG. 2a is a schematic diagram of a construction of a conventional CCD image sensor of the interlaced scanning type.
Figure 2B:
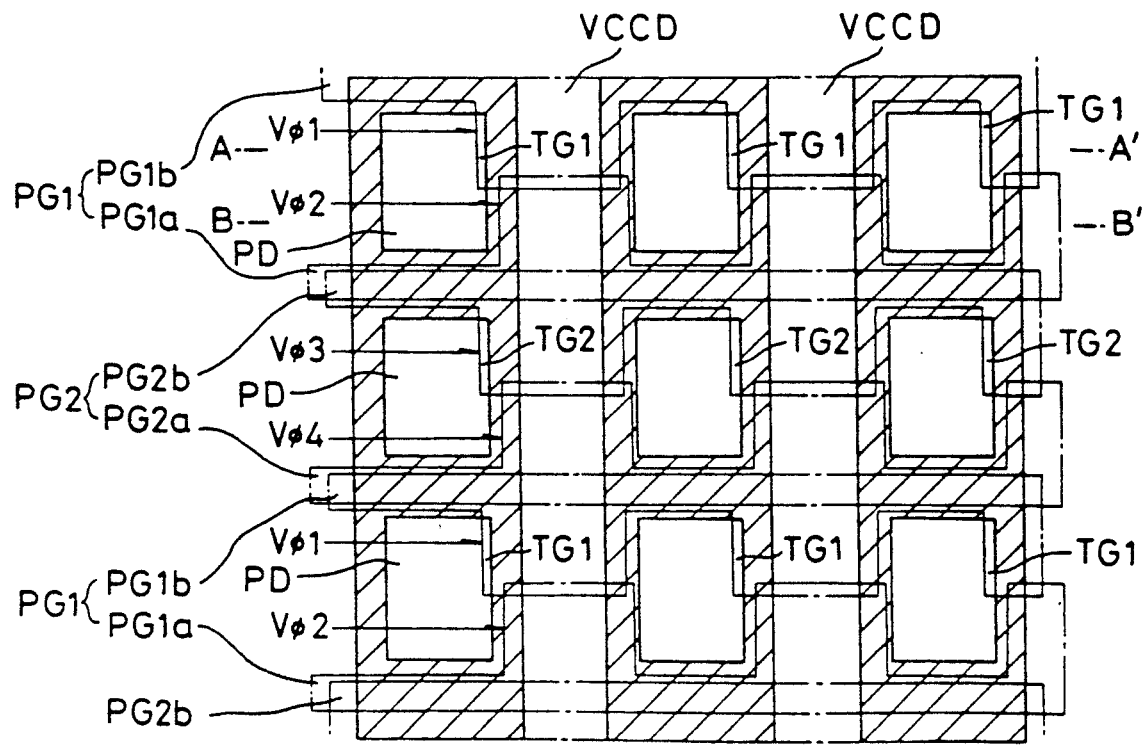
Figure 2C:
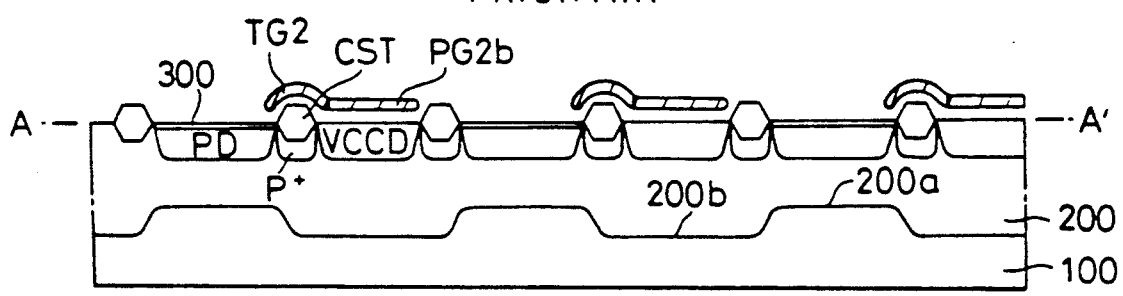
FIG. 2c is a sectional view, taken on the A—A' of FIG. 2b.
Figure 2D:
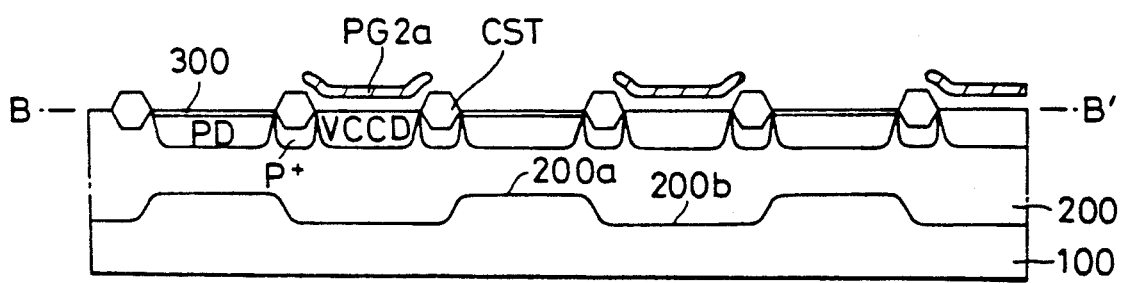
FIG. 2d is a sectional view, taken on the line B—B' of FIG. 2b.
Figure 4A:
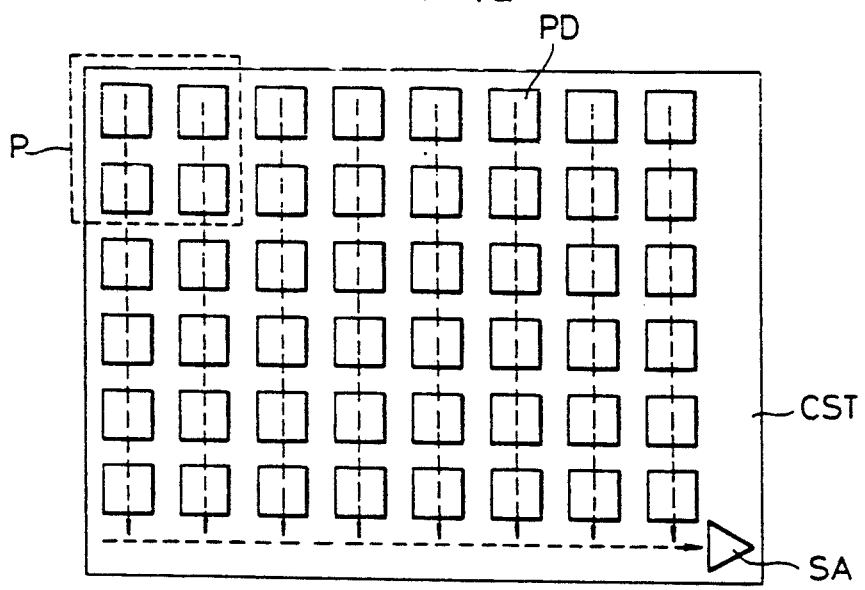
FIG. 4a is a plan view of a construction of a three-dimensional CCD image sensor of the present invention.

Referring to FIG. 4a, there is shown a plan view of a construction of a three-dimensional CCD image sensor of the present invention. In this drawing, the three-dimensional CCD image sensor of the present invention is shown to comprise a plurality of N type photodiodes PD as light receiving regions, each being formed on a surface thereof at a desired interval between each other. Also, the three-dimensional CCD image sensor of the present invention comprises a N type HCCD (hereinafter shown) and a plurality of N type VCCDs (hereinafter shown), each being formed three-dimensionally under the N type photodiodes PD.

In FIG. 4a, lines dotted in a vertical direction indicate the form that signal charges of light produced from respective columns of the N type photodiodes PD are transferred to the N type HCCD through the N type VCCDs by the clocking operation. Also, a line dotted in a horizontal direction indicates the form that the signal charges traveling from each of the N type VCCDs are transferred to a sense amplifier SA through the N type HCCD by the clocking operation.

Also, a hatched portion indicates a P+ type channel stop region CST.

Figure 4B:
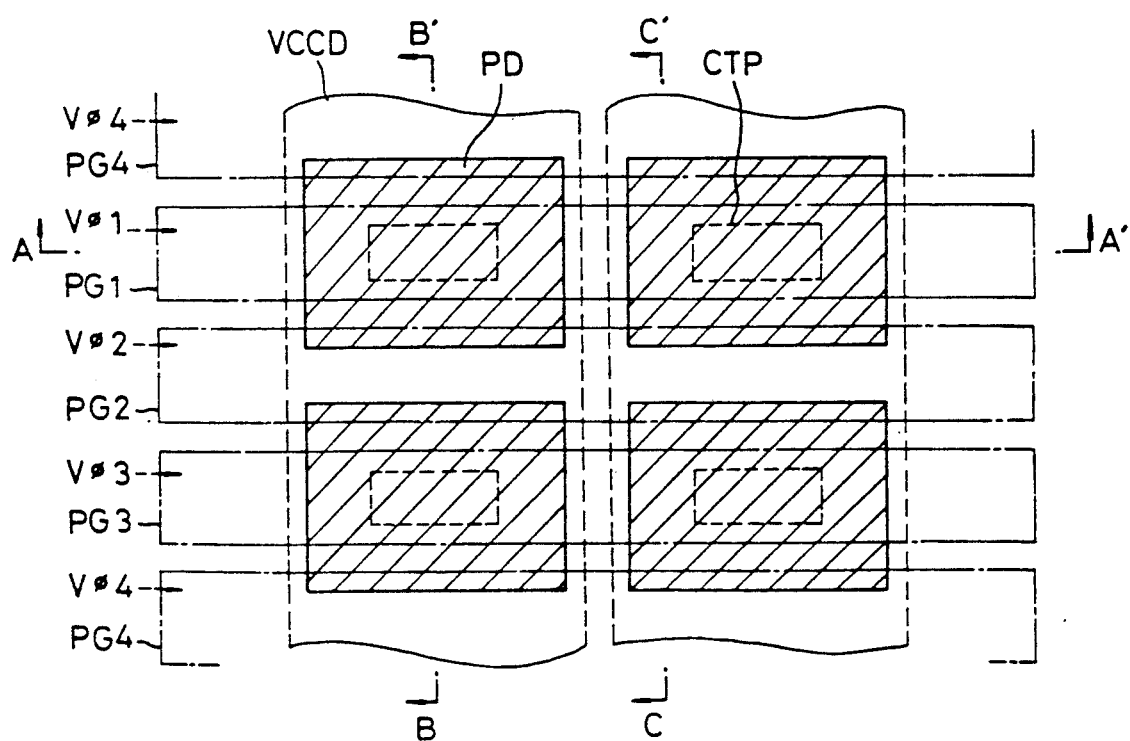

Referring to FIG. 4b, there is shown a layout diagram of a portion of P in FIG. 4a. First to fourth gate polysilicon layers PG1-PG4 are configured as gate electrodes which are formed in sequence in a horizontal direction at desired intervals. Also there are configured a series of arrangements that the N type VCCDs are formed perpendicularly to the first to fourth gate polysilicon layers PG1-PG4 at desired intervals. Between each of the N type photodiodes PD and each of the N type VCCDs are formed a signal charge transfer path CTP and a P+ type charge transfer barrier (not shown in FIG. 4b) at the remaining portion.

The first gate polysilicon layer PG1 is formed under the N type Photodiodes PD in each of odd horizontal lines, the third gate polysilicon layer PG3 is formed under the N type photodiodes PD in each of even horizontal lines, and the second gate polysilicon layer PG2 and the fourth gate polysilicon layer PG4 are formed under and between the N type photodiodes PD in each of odd horizontal lines and the N type photodiodes PD in each of even horizontal lines. Herein, the reference numerals $V\phi1-V\phi4$ designate a first through a fourth clock signals, each being applied to the gate polysilicon layers PG1-PG4.

Figure 4C:
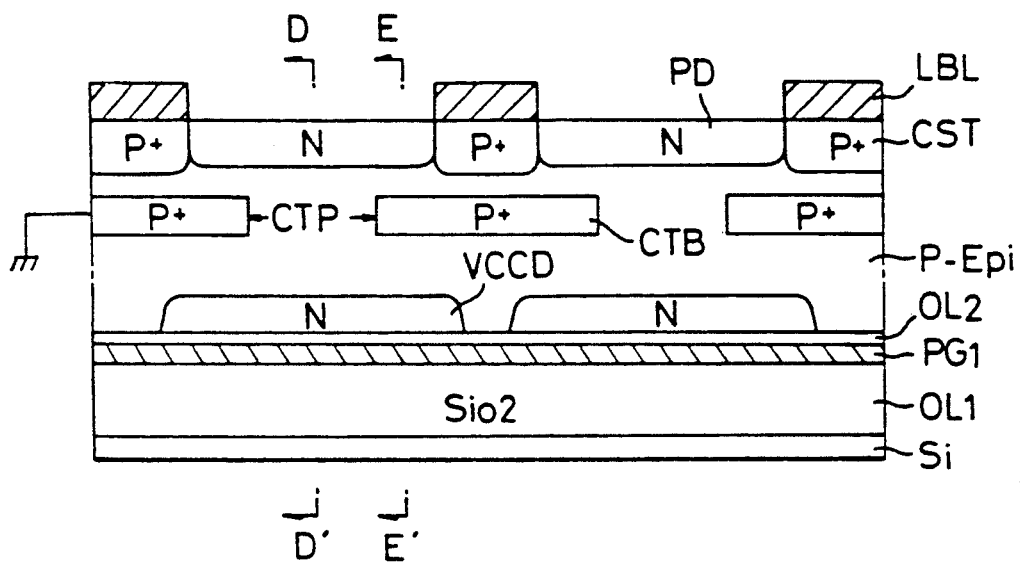
FIG. 4c is a sectional view, taken on the line A—A' of FIG. 4b.

Referring to FIG. 4c, there is shown a sectional view, taken on the line A—A' of FIG. 4b. In this drawing, the three-dimensional CCD image sensor of the present invention is shown to comprise a silicon substrate Si. An oxide layer OL1 is formed on the silicon substrate Si, for embodying the SOI structure. On the oxide layer OL1 are formed in sequence the first gate polysilicon layer PG1 for the applying of the first clock signal $V\phi1$ and then a gate oxide layer OL2. On the gate oxide layer OL2 is formed a P type epitaxial layer P-EPi to a predetermined thickness. On each of the upper and lower surfaces of the P type epitaxial layer P-EPi are formed, opposite to each other, N type photodiodes arranged in odd horizontal lines and the N type VCCDs arranged in odd and even vertical lines. Between each of the N type photodiodes PD and each of the N type VCCDs are formed charge transfer paths CTP through which the signal charges of light are to be passed and the P+ type charge transfer barrier CTB at the remaining portion is electrically connected to ground. Also on the P+ type channel stop region CST is formed a light blocking layer LBL for preventing incident light from reaching the channel stop region CST.

Figure 4D:
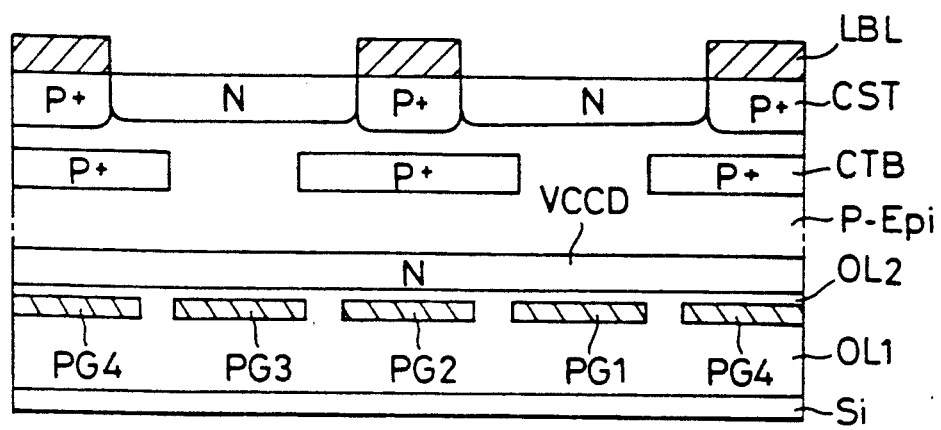
FIG. 4d is a sectional view, taken on the line B—B' of FIG. 4b.

Referring to FIG. 4d, there is shown a sectional view, taken on the line B—B' of FIG. 4b. This drawing is identical to FIG. 4c, except that there is shown the first through fourth gate polysilicon layers PG1-PG4 being formed under and perpendicular to the N type VCCDs arranged in odd vertical lines.

Referring to FIG. 4e, there is shown a sectional view, taken on the line C—C' of FIG. 4b. This drawing is identical to FIG. 4d, except there is shown the P+ type charge transfer barrier CTB being formed at all of portions outside the charge transfer path CTP.

Figure 4F:
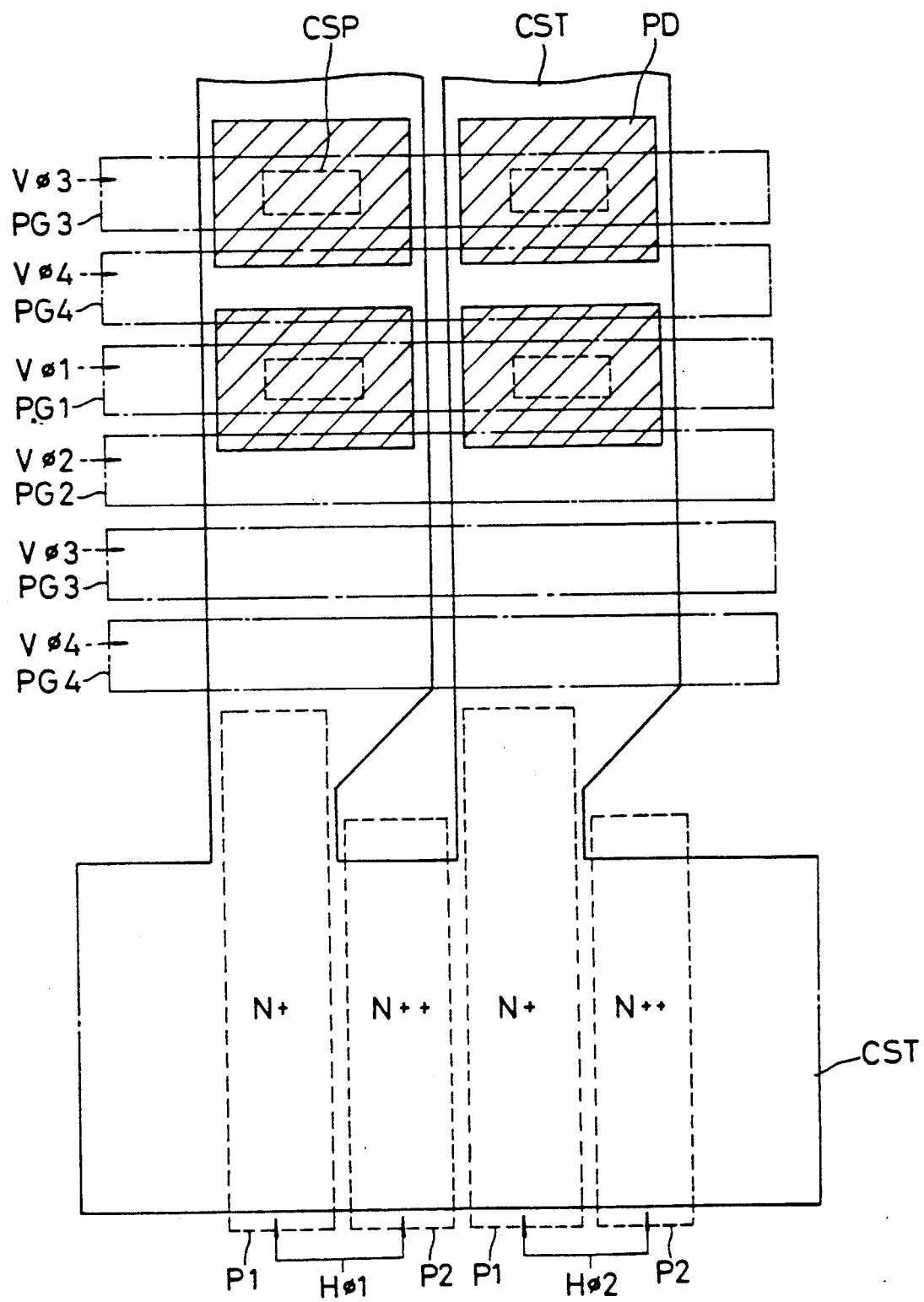
FIG. 4f is a detailed diagram of a N type HCCD in the three-dimensional CCD image sensor of the present invention.

Referring to FIG. 4f, there is shown a detailed diagram of the N type HCCD in the three-dimensional CCD image sensor of the present invention. The N type HCCD is formed on the end portion of arrangement of the N type photodiodes PD. In the N type HCCD, there are included a first polysilicon layer P1 and a second polysilicon layer P2. For the purpose of the signal charge transfer, the first polysilicon layer P1 is doped with a N type ion more concentratedly than that of the second polysilicon layer P2.

Of course, materials of these layers P1 and P2 may be polysilicons of the same component, applied with the same clock signal $H\phi1-H\phi2$.

Next, a process for making the three-dimensional CCD image sensor with the above-mentioned construction in accordance with the present invention will be described with reference to FIGS. 5a through 5j.

Referring to FIGS. 5a through 5j, there are shown sectional views illustrating in sequence the various steps of the process for making the three-dimensional CCD image sensor of the present invention.

Figure 5A:
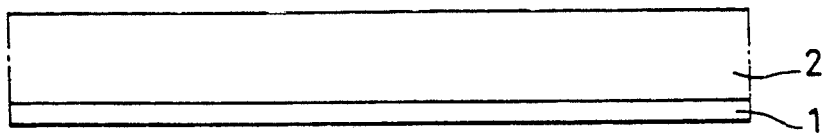
FIGS. 5a through 5j are sectional views illustrating in sequence the various steps of a process for making the three-dimensional CCD image sensor of the present invention.
Figure 5B:
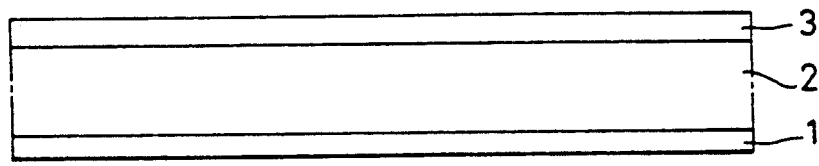

First, the SOI structure is formed on a silicon substrate 1 by growing an oxide layer 2 to a predetermined thickness on the silicon substrate 1, as shown in FIG. 5a, and on the oxide layer 2 are then formed a plurality of gate polysilicon electrodes 3 which are polysilicon layers separated from each other by the desired separation intervals for applying of clock signals to the N type VCCDs, as shown in FIG. 5b.

Figure 5C:
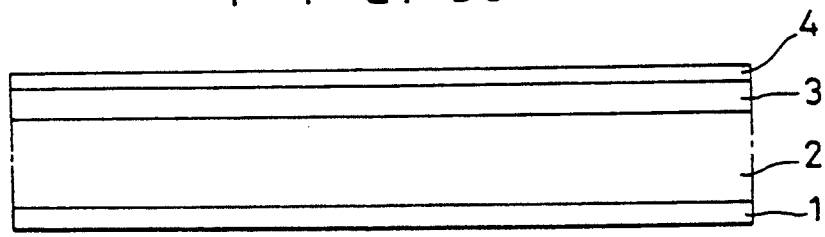
Figure 5D:
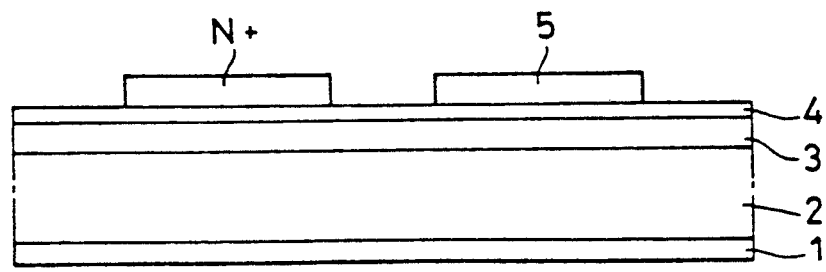

Thereafter, after a thin gate oxide layer 4 is formed on the whole surface including the gate polysilicon layers 3, as shown FIG. 5c, N+ type ion layers 5 are deposited to a predetermined thickness on desired portions of the gate oxide layer 4 using low energy, as shown in FIG. 5d.

Figure 5E:
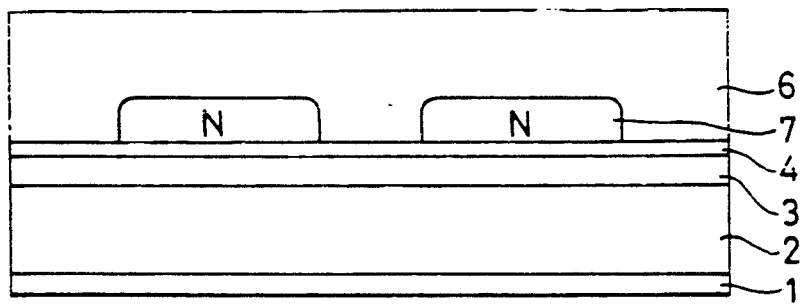

A first P type epitaxial layer 6 is then grown on the surface of the gate oxide layer 4 and the N+ type ion layers 5, as shown in FIG. 5e. At this time, the N+ type ion layers 5 are diffused, so that N type VCCDs 7 are formed.

Figure 5F:
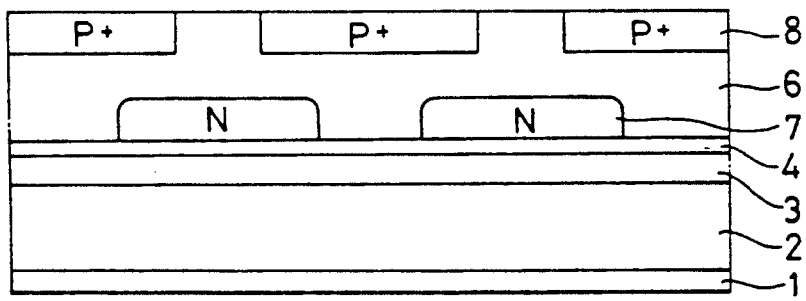

P+ type thin layers 8 are then formed by injecting a P+ type ion into the remaining portions except central portions above the N type VCCDs 7 in the surface of the first P type epitaxial layer 6, as shown in FIG. 5f.

At this time, the remaining central portions above the N type VCCDs 7 will be used later as charge transfer paths. On the other hand, the P+ type thin layers 8 will be used later as charge transfer barriers.

Figure 5G:
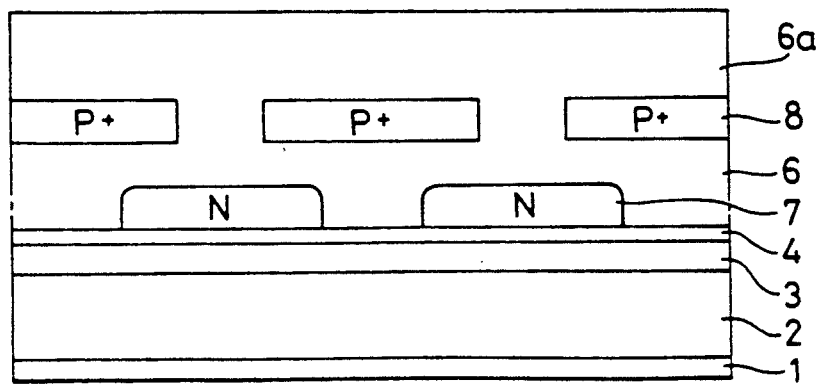

A second P type epitaxial layer 6a is then grown on the surface of the first P type epitaxial layer 6 and the P+ type thin layers 8, having the same component as that of the first P type epitaxial layer 6, as shown in FIG. 5g. For this reason, the P+ type thin layers 8 are buried in the P type epitaxial layer.

Figure 5H:
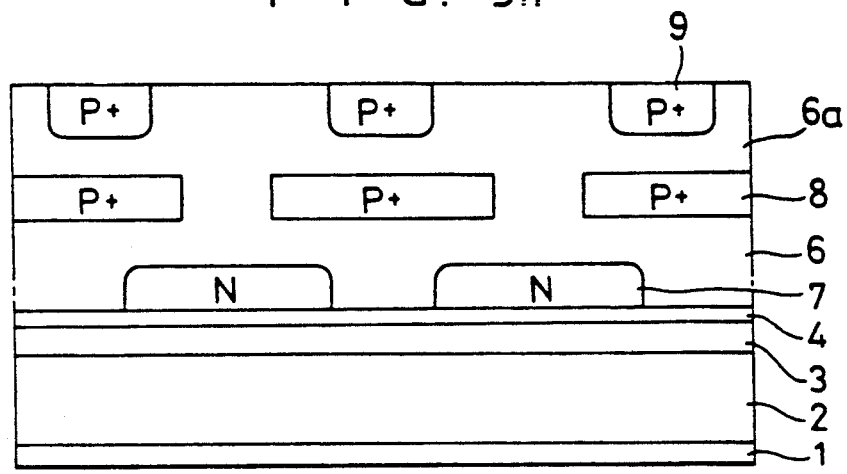

Thereafter, P+ type channel stop layers 9 are formed by injecting a P+ type ion into the remaining portions except portions above the N type VCCDs 7 in the surface of the second P type epitaxial layer 6a, as shown FIG. 5h.

Figure 5I:
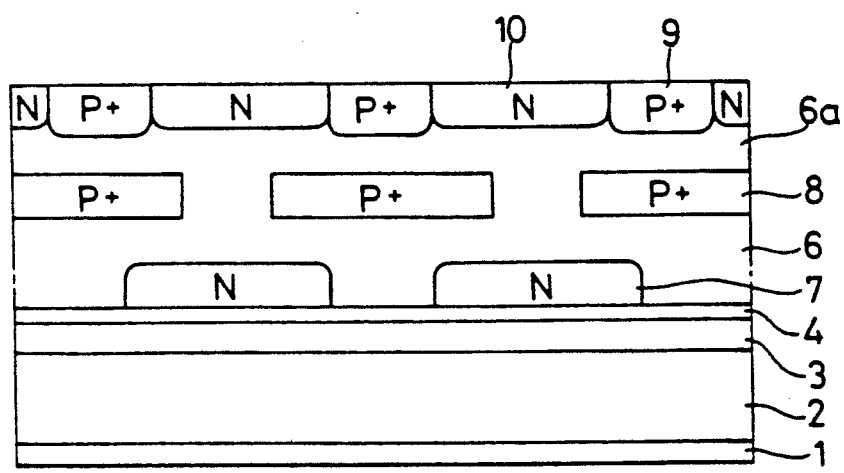

N type photodiodes 10 are then formed by injecting a N type ion into portions above the N type VCCDs 7 in the surface of the P type epitaxial layer 6a, as shown in FIG. 5i.

As a result, on the two-dimensional surface are arranged at a desired interval only a plurality of N type photodiodes 10 for receiving light, and the N type VCCDs 7 are arranged under the N type photodiodes 10 correspondingly to them.

Figure 5J:
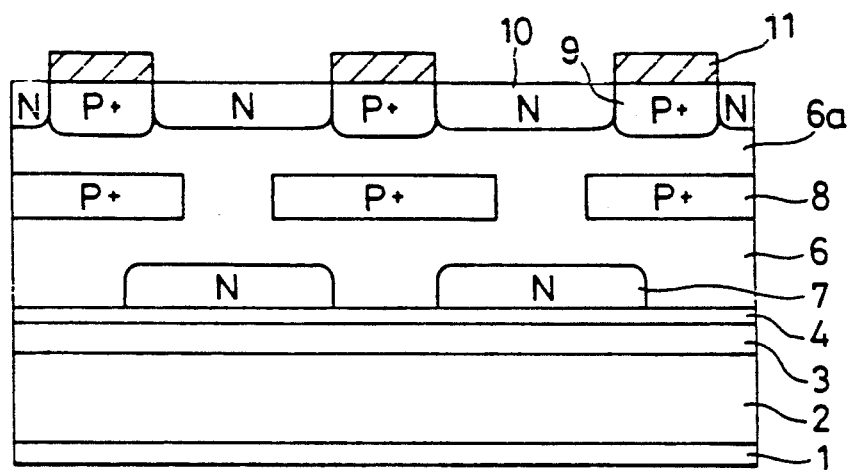

Finally, on the P+ type channel stop layers 9 are formed thin metallic layers 11 as light blocking layers for preventing incident light from entering, as shown in FIG. 5j.

The construction of FIGS. 5a through 5j is substantially similar to that of FIGS. 4a through 4f, in that the process of FIGS. 5a through 5j produces the three-dimensional CCD image sensor with the construction of FIGS. 4a through 4f according to the present invention, and hence the remaining parts will not be described in further detail.

The operation of the three-dimensional CCD image sensor with the construction as mentioned above in accordance with the present invention will now be described in detail with reference to FIGS. 6a, 6b, 7a and 7b.

Referring to FIGS. 6a, 6b, 7a and 7b, there are shown views illustrating potential profiles, taken on the lines D—D' and E—E' of FIG. 4c, respectively. Herein, a timing of the first to fourth clock signals $V\phi1$-$V\phi4$ utilized by the present invention is the same as that by the prior art as shown in FIGS. 3a and 3b. As previously stated, FIG. 3a is a timing diagram of the first through fourth VCCD clock signals $V\phi1$-$V\phi4$ of four phases, each including two fields, an even field and an odd field. Also, FIG. 3b is a pulse wave form diagram of the first through fourth clock signals $V\phi1$-$V\phi4$ at the unit interval K of FIG. 3a.

Figure 6A:
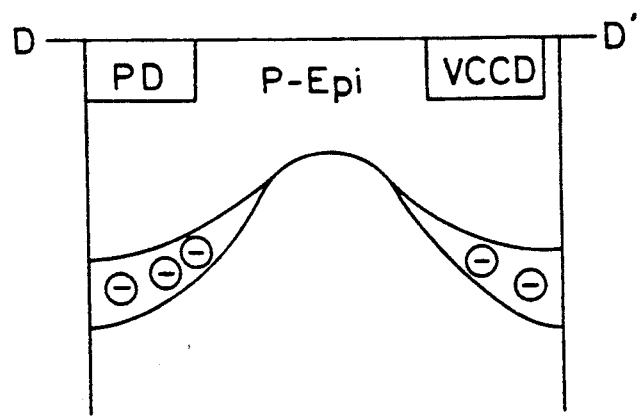

First, upon receiving incident light, the N type photodiodes PD store the signal charges corresponding to light in their lower sides, as shown in FIGS. 6a and 7a. At this time, the potential profiles are defined as high barriers being formed in the charge transfer paths CTPs of the P type epitaxial layer P-EPi. These high barriers cause the signal charges stored in the lower sides of the N type photodiodes PD to be not transferred to the N type VCCDs.

Then, if the first through fourth VCCD clock signals $V\phi1$-$V\phi4$ of timing as shown in FIG. 3a are applied respectively to the gate polysilicon layers PG1-PG4 in FIG. 4b, the potentials of the N type VCCDs are dropped considerably low by the drive voltage signal V1 contained in the first VCCD clock signal $V\phi1$ contained in the odd field, as shown FIG. 6b. For this reason, the signal charges stored in the N type photodiodes PD arranged in the horizontal line are transferred to the lower N type VCCDs through the charge transfer paths CTPs.

Also, the potentials of the N type VCCDs are dropped considerably low by the drive voltage signal V2 contained in the third VCCD clock signal $V\phi3$ contained in the even field, as shown FIG. 6b, and hence the signal charges stored in the N type photodiodes PD arranged in the even horizontal line are transferred to the lower N type VCCDs through the charge transfer paths CTPs. At this time, the second and fourth VCCD clock signals $V\phi2$ and $V\phi4$ applied to the second and fourth gate polysilicon layers PG2 and PG4 formed under below and between each of the N type photodiodes PD in odd horizontal lines and each of the N type photodiodes PD in even horizontal lines serve to smoothly transfer the signal charges to the N type HCCD shown in FIG. 4f, together with the first and third VCCD clock signals $V\phi1$ and $V\phi3$.

As above-stated, the use of the VCCD clock signals of four phases has the effect of transferring the image signal charges more rapidly than that of the VCCD clock signals of two phases.

Therefore, by the VCCD clock signals $V\phi1$-$V\phi4$ of four phases, the image signal charges stored in the N type photodiodes PD arranged in odd horizontal lines are first in sequence scanned on the screen through the N type VCCDs and then through the N type HCCD and then the image signal charges stored in the N type photodiodes PD arranged in the even horizontal lines are in sequence scanned on the screen through the N type VCCDs and then through the N type HCCD, as shown in FIG. 3c.

As hereinbefore described, in accordance with the present invention, there is provided a three-dimensional CCD image sensor in which only a plurality of light receiving regions for receiving light are arranged at a desired interval on the two-dimensional surface thereof. Therefore, the existing fill factor of about 20% of the light receiving region can be enhanced by up to about 80%, thereby enabling the making of the CCD image sensor with a high resolution.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A three dimensional CCD image sensor, comprising:
   a silicon substrate;
   an oxide layer formed to a desired thickness on said silicon substrate;
   a plurality of gate electrodes formed repeatedly at a desired interval on said oxide layer, for applying clock signals;
   a thin gate oxide layer formed on a whole surface of said oxide layer including said plurality of gate electrodes;
   a P type epitaxial layer formed to a predetermined thickness on said gate oxide layer;
   a plurality of N type light receiving regions formed on an upper surface of said P type epitaxial layer, for receiving light;
   a plurality of N type VCCD regions formed on a lower surface of said P type epitaxial layer, for inputting signal charges of light being produced from said plurality of N type light receiving regions, such that said plurality of N type light receiving regions and said plurality of N type VCCD regions are formed opposite to each other and spaced in sequence at a desired spacing interval on said upper and lower surfaces of said P type epitaxial layer;

a desired area of a charge transfer path formed out of the P type epitaxial layer between each of said plurality of N type light receiving regions and each of said plurality of N type VCCD regions, said signal charges of light passed through said charge transfer path; and a P+ charge transfer barrier formed to a predetermined thickness at the remaining portion except where said charge transfer path is to be formed, between each of said plurality of N type light receiving regions and each of said plurality of N type VCCD regions;

whereby said signal charges stored in the lower side of each said plurality of N type light receiving regions are transferred to the corresponding N type VCCD regions.

2. A three-dimensional CCD image sensor in accordance with claim 1, wherein said plurality of gate electrodes include a first through a fourth gate electrodes, said first gate electrode being formed under said plurality of N type light receiving regions in an odd horizontal line, said third gate electrode being formed under said plurality of N type light receiving regions in an even horizontal line, and said second and fourth gate electrodes being formed under below and between said plurality of N type light receiving regions in said odd horizontal line and said plurality of N type light receiving regions in said even horizontal line, for performing a four phase clocking operation.

3. A three-dimensional CCD image sensor in accordance with claim 1 further comprising:
 a P+ type channel stop layer formed between said plurality of N type light receiving regions, each being arranged on a two-dimensional plane; and
 a light blocking layer formed on said P+ type channel stop layer.

4. A three-dimensional CCD image sensor in accordance with claim 1, wherein materials of said plurality of gate electrodes are polysilicons of the same component.

5. A three-dimensional CCD image sensor in accordance with claim 1, wherein said N type light receiving region includes a photodiode using a PN junction.

6. A three dimensional CCD image sensor, comprising:
 a silicon substrate;
 an oxide layer formed to a desired thickness on said silicon substrate;
 a plurality of gate electrodes formed of polysilicon layers separated from each other by a desired separation interval on said oxide layer, said gate electrodes constructed and arranged for receiving clock signals;
 a thin gate oxide layer formed on the whole surface of said oxide layer including said plurality of gate electrodes;
 an N+ type ion layer formed on the surface of gate oxide layer using low energy;
 a P type epitaxial layer formed to a predetermined thickness on said gate oxide layer and the N+ type ion layers;
 a plurality of N type light receiving regions formed on the upper surface of said P type epitaxial layer, for receiving light;
 a plurality of N type VCCD formed on the lower surface of said P type epitaxial layer by diffusing the N+ regions, for inputting signal charges of light produced from said plurality of N type light receiving regions;

wherein the layers are arranged such that said plurality of N type light receiving regions and said plurality of N type VCCD regions are formed opposite to each other and spaced in sequence at a desired spacing interval on said upper and lower surfaces of said P type epitaxial layer;

a desired area of a charge transfer path formed out of the P type epitaxial layer between each of said plurality of N type light receiving regions and each of said plurality of N type VCCD regions, said signal charges of light passed through said charge transfer path;

a P+ type charge transfer barrier formed to a predetermined thickness at the remaining portion, between each of said plurality of N type light receiving regions and each of said plurality of N type VCCD regions except where said charge transfer path is to be formed;

whereby said signal charges stored in the lower side of each said plurality of N type light receiving regions are transferred to the corresponding N type VCCD regions by clock signals applied to said gate electrodes.

7. A three-dimensional CCD image sensor in accordance with claim 6, wherein said plurality of gate electrodes include first through fourth gate electrodes, said first gate electrode formed under said plurality of N type light receiving regions in an odd horizontal line, said third gate electrode formed under said plurality of N type light receiving regions in an even horizontal line, and said second and fourth gate electrodes formed below and between said plurality of N type light receiving regions in said odd horizontal line and said plurality of N type light receiving regions in said even horizontal line, for performing a four phase clocking operation.

8. A three-dimensional CCD image sensor in accordance with claim 6, further comprising:
 a P+ type channel stop layer (9) formed between said plurality of N type light receiving regions (10), each arranged on a two-dimensional plane; and
 a light blocking layer (11) formed on said P+ type channel stop layer (9).

9. A three-dimensional CCD image sensor in accordance with claim 6, wherein materials of said plurality of gate electrodes are polysilicons of the same component.

10. A three-dimensional CCD image sensor in accordance with claim 6, wherein said N type light receiving region (10) includes a photodiode using a PN junction.

11. A three dimensional CCD image sensor, comprising:
 a silicon substrate;
 an oxide layer formed on the silicon substrate;
 a plurality of gate electrodes for applying clock signals formed repeatedly at a desired interval on the oxide layer;
 a thin gate oxide layer formed on the surface of the oxide layer and the gate electrodes
 a P type epitaxial layer formed to a predetermined thickness on said gate oxide layer, the P type epitaxial layer having an upper and lower surface;
 a plurality of N type light receiving regions formed on the upper surface of the P type epitaxial layer;

an N type VCCD region associated with each N type light receiving region, each VCCD region formed on the lower surface of said P type epitaxial layer opposite the associated N type light receiving region, such that the area of the P type epitaxial layer located in between each pair of N type light receiving regions and N type VCCD region comprises a charge transfer path through which signal charges stored in the lower side of each N type light receiving region may transfer to the associated N type VCCD region; and a plurality of P+ type charge transfer barriers formed in the P type epitaxial layer between each of said plurality of charge transfer paths.

* * * * *